(12) United States Patent
Liaw

(10) Patent No.: US 8,750,011 B2
(45) Date of Patent: Jun. 10, 2014

(54) APPARATUS FOR ROM CELLS

(75) Inventor: Jhon-Jhy Liaw, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 145 days.

(21) Appl. No.: 13/423,968

(22) Filed: Mar. 19, 2012

(65) Prior Publication Data

US 2013/0242633 A1 Sep. 19, 2013

(51) Int. Cl.
*G11C 5/06* (2006.01)

(52) U.S. Cl.
USPC ............ 365/72; 365/63; 365/84; 257/700; 257/758

(58) Field of Classification Search
USPC ......... 365/63, 72, 94, 103; 257/700, 758, 774
See application file for complete search history.

(56) References Cited

U.S. PATENT DOCUMENTS

| | | | |
|---|---|---|---|
| 6,316,801 B1* | 11/2001 | Amanuma | 257/306 |
| 6,603,203 B2* | 8/2003 | Amanuma | 257/758 |
| 7,977,232 B2* | 7/2011 | Eto | 438/622 |
| 2001/0038115 A1* | 11/2001 | Amanuma | 257/303 |
| 2003/0219924 A1* | 11/2003 | Bez et al. | 438/102 |
| 2009/0146260 A1* | 6/2009 | Eto | 257/620 |
| 2010/0246152 A1* | 9/2010 | Lin et al. | 361/783 |

\* cited by examiner

*Primary Examiner* — Gene Auduong
(74) *Attorney, Agent, or Firm* — Slater and Matsil, L.L.P.

(57) ABSTRACT

A ROM cell comprises a first first-level contact formed on a first active region of a transistor of a memory cell, a first second-level contact formed on the first first-level contact, wherein the first second-level contact shifts in a first direction with reference to the first first-level contact. The ROM cell further comprises a second first-level contact formed on a second active region of the transistor of the memory cell, wherein the second first-level contact is aligned with the first first-level contact and a second second-level formed on the second first-level contact, wherein the second second-level contact shifts in a second direction with reference to the second first-level contact, and wherein the first direction is opposite to the second direction.

20 Claims, 16 Drawing Sheets

APPARATUS FOR ROM CELLS

BACKGROUND

Modern electronic devices such as a notebook computer comprise a variety of memories to store information. Memory circuits include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered. On the other hand, non-volatile memories can keep data stored on them. Non-volatile memories include a variety of sub-categories, such as read-only-memory (ROM), electrically erasable programmable read-only memory (EEPROM) and flash memory.

ROM is a type of solid state memory. Each ROM cell is fabricated with a desired logic state. In other words, a bit of binary data is permanently stored in a ROM cell either in a logic state of "0" or "1" depending on whether there is a conductive path between a bit line and a VSS line. In accordance with a definition of a ROM cell's logic, when a logic state of "1" is stored in a ROM cell, there is a connected path from a bit line to a VSS line. On the other hand, when a logic state of "0" is stored in a ROM cell, there is no connected path from the bit line to the VSS line. The definition of "0" and "1" described above can be swapped depending on different applications.

As technologies evolve, semiconductor process nodes have been scaled down for high density ROM integrated circuits. As a result, the form factor of ROM integrated circuit has been improved from shrinking the semiconductor process node (e.g., shrink the process node towards the sub-20 nm node). As semiconductor devices are scaled down, new techniques are needed to maintain the electronic components' performance from one generation to the next. For example, low leakage current transistors are desirable for high density and high speed ROM integrated circuits.

Fin field-effect transistors (FinFETs) have emerged as an effective alternative to further reduce leakage current in semiconductor devices. In contrast to the prior planar MOS transistor, which has a channel formed at the surface of a semiconductor substrate, a FinFET has a three dimensional channel region. In a FinFET, an active region including the drain, the channel region and the source protrudes up from the surface of the semiconductor substrate upon which the FinFET is located. The active region of the FinFET, like a fin, is rectangular in shape from a cross section view. In addition, the gate structure of the FinFET wraps the active region around three sides like an upside-down U. As a result, the gate structure's control of the channel has become stronger. The short channel leakage effect of conventional planar transistors has been reduced. As such, when the FinFET is turned off, the gate structure can better control the channel so as to reduce leakage current.

The three-dimensional shape of the FinFET channel region allows for an increased gate width without increased silicon area even as the overall scale of the devices is reduced with semiconductor process scaling, and in conjunction with a reduced gate length, providing a reasonable channel width characteristic at a low silicon area cost.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, apparatus for high density and high speed read-only-memory (ROM) array to be fabricated within an integrated circuit. The embodiments of the disclosure may also be applied, however, to a variety of memory circuits. Hereinafter, various embodiments will be explained in detail with reference to the accompanying drawings.

Figure 1:
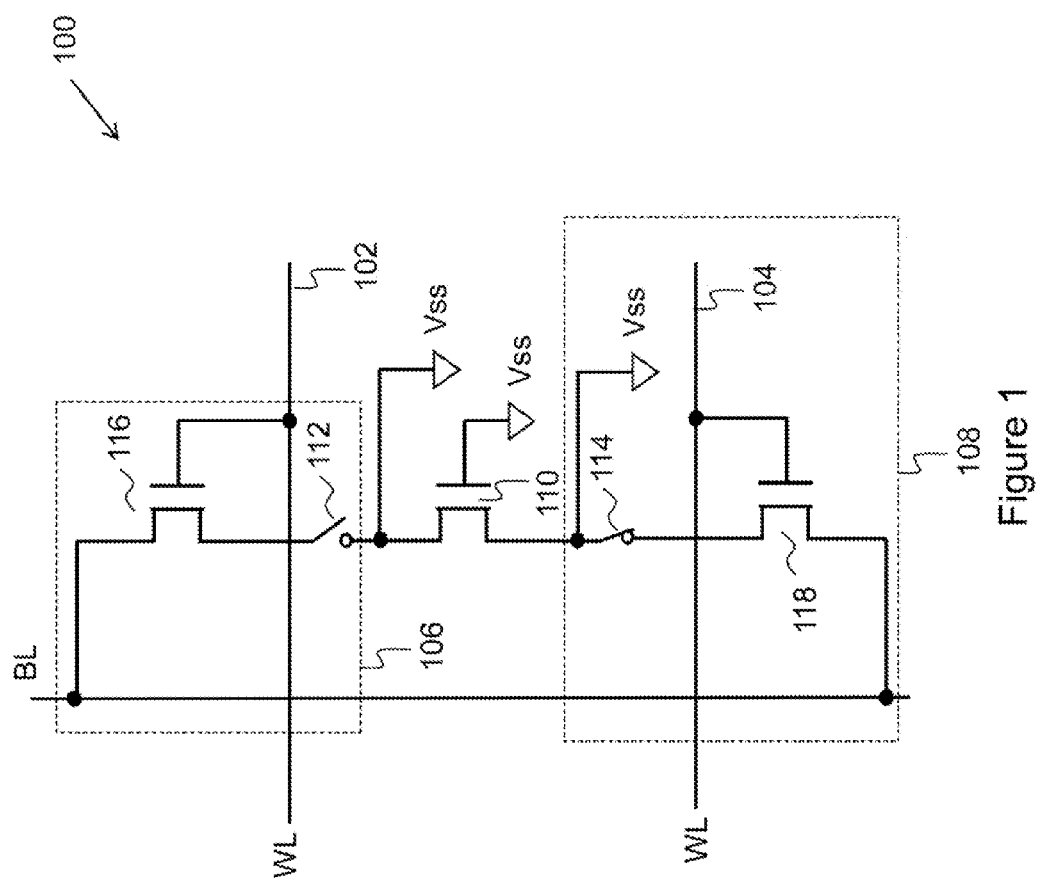
FIG. 1 illustrates a schematic diagram of two adjacent read-only-memory (ROM) cells in a ROM cell array in accordance with an embodiment.

FIG. 1 illustrates a schematic diagram of two adjacent ROM cells in a ROM cell array in accordance with an embodiment. The ROM cell array 100 comprises a first ROM cell 106 and a second ROM cell 108. There is an isolation transistor 110 coupled between the first ROM cell 106 and the second ROM cell 108. In accordance with an embodiment, the isolation transistor 110 is an n-type metal oxide semiconductor (NMOS) transistor. In addition, the isolation transistor 110 may be an NMOS transistor having a fin structure protruding over surface of the semiconductor substrate and a gate wrapping the fin structure around the three sides of the fin structure.

As shown in FIG. 1, the drain and source of the isolation transistor 110 are coupled to the VSS lines of the first ROM cell 106 and the second ROM cell 108 respectively. Moreover, the gate of the isolation transistor 110 is coupled to VSS. As a result, the isolation transistor 110 is in a turn-off state. The isolation transistor 110 does not provide any electrical function. Instead, the isolation transistor 110 provides an isolation barrier between two adjacent ROM cells (e.g., ROM cell 106 and ROM cell 108) of a ROM cell array. Such an isolation barrier prevents active current flowing between two adjacent ROM cells so that two adjacent ROM cells can share a continuous active region.

The first ROM cell 106 has a drain coupled to a bit line BL, a gate coupled to a first word line 102 and a source coupled to VSS through a first switch 112. According to the fabrication process of ROM cells, the first switch 112 is not an active switch. Instead, the first switch 112 is implemented by a coding layer. The detailed description of the coding layer will be discussed below with respect to FIG. 6. As shown in FIG. 1, the first switch 112 is turned off. As a result, a conductive path is not established between the bit line BL and VSS. In response to a READ signal applied to the first word line 102, no current can be read out from the bit line BL. Therefore, the first ROM cell 106 may represent an "off" state.

The second ROM cell 108 has a drain coupled to the bit line BL, a gate coupled to a second word line 104 and a source coupled to VSS through a second switch 118. As shown in FIG. 1, the second switch 118 is turned on. As a result, a conductive path is established between the bit line BL and VSS. In response to a READ signal applied to the second word line 104, a current signal can be read out from the bit line BL. Therefore, the second ROM cell 108 may represent an "on" state. In accordance with an embodiment, the "on" state and the "off" state of ROM cells may represent a logic state of "1" and a logic state of "0" respectively. Alternatively, the "on" state and the "off" state of ROM cells may represent a logic state of "0" and a logic state of "1" respectively.

As shown in FIG. 1, the ROM cell array 100 shown comprises three transistors, namely the first pass transistor 116 of the first ROM cell 106, the isolation transistor 110 and the second pass transistor 118 of the second ROM cell 108. Each transistor can be implemented by a planar transistor. As technologies evolve, semiconductor process nodes have been scaled down to a sub-20 nm level. Low leakage current transistors are an effective alternative to further improve the performance of ROM integrated circuits. As a consequence, the transistors shown in FIG. 1 may be implemented by FinFETs.

Figure 2:
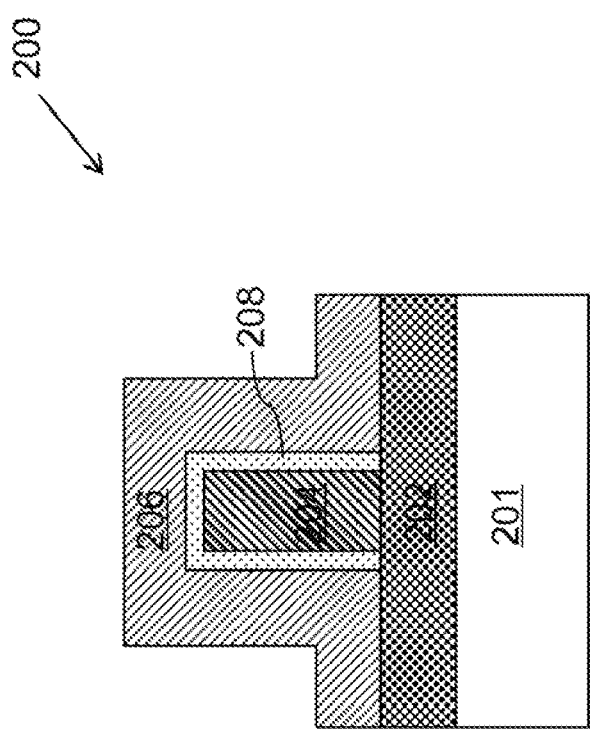
FIG. 2 illustrates a cross sectional view of a fin field effect transistor (FinFET) in accordance with an embodiment.

FIG. 2 illustrates a cross sectional view of a fin field effect transistor (FinFET) in accordance with an embodiment. The FinFET 200 is of a silicon-on-insulator (SOI) FinFET structure. In the FinFET 200, an active region 204 includes a drain, a source and a channel region coupled between the drain and the source. The active region 204 protrudes up from the surface of the semiconductor substrate 201 upon which the FinFET is located. The active region 204 of the FinFET 200, like a fin, is rectangular in shape from a cross section view. In addition, the gate structure 206 of the FinFET 200 wraps the active region 204 around three sides like an upside-down U.

In accordance with an embodiment, the FinFET 200 comprises a substrate 201 and an SOI layer 202 formed over the substrate 201. In other words, the substrate 201 and the SOI layer 202 form an SOI substrate. In accordance with an embodiment, the SOI layer 202 is formed of silicon dioxide. The substrate 201 may be formed of silicon, although it may also be formed of other group III, group IV, and/or group V elements, such as silicon, germanium, gallium, arsenic, and combinations thereof. In accordance with an embodiment, the substrate 201 may be a lightly doped n-type substrate, which is formed by implanting n-type dopants such as phosphorous at a concentration of between about $5 \times 10^{16}/cm^3$ and about $9 \times 10^{18}/cm^3$.

As shown in FIG. 2, there may be a gate dielectric layer 208 formed between the active region 204 and the gate structure 206. The gate dielectric layer 208 may be formed of oxide materials and formed by suitable oxidation processes such as wet or dry thermal oxidation, sputtering or by CVD techniques using tetra-ethyl-ortho-silicate (TEOS) and oxygen as a precursor. In addition, the gate dielectric layer 208 may be a high-K dielectric material (K>10), such as silicon oxide, silicon oxynitride, silicon nitride, an oxide, a nitrogen-containing oxide, aluminum oxide, lanthanum oxide, hafnium oxide, zirconium oxide, hafnium oxynitride, a combination thereof, or the like.

The gate structure 206 may comprise a conductive material selected from a group comprising of polycrystalline-silicon (poly-Si), poly-crystalline silicon-germanium (poly-SiGe), metal materials, metal silicide materials, metal nitride materials, metal oxide materials and the like. For example, metal materials may include tantalum, titanium, molybdenum, tungsten, platinum, aluminum, hafnium, ruthenium, a combination thereof and the like. Metal silicide materials include titanium silicide, cobalt silicide, nickel silicide, tantalum silicide, a combination thereof and the like. Metal nitride materials include titanium nitride, tantalum nitride, tungsten nitride, a combination thereof and the like. Metal oxide materials include ruthenium oxide, indium tin oxide, a combination thereof and the like.

It should be noted that other fabrication processes may be used to form the gate structure 206. Other fabrication processes include but is not limited to CVD, physical vapor deposition (PVD), plasma enhanced CVD (PECVD), atmospheric pressure CVD (APCVD), high density plasma CVD (HD CVD), low-pressure chemical vapor deposition (LPCVD), atomic layer CVD (ALCVD) and the like.

Figure 3:
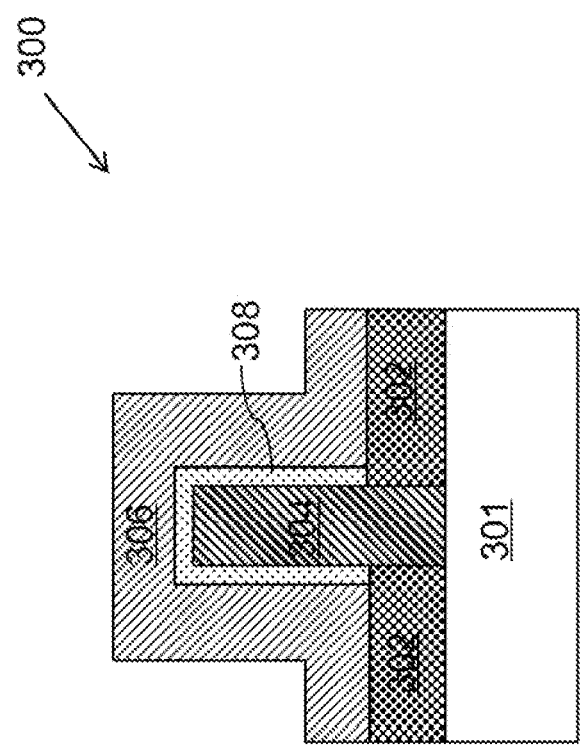
FIG. 3 illustrates a cross sectional view of a FinFET in accordance with another embodiment.

FIG. 3 illustrates a cross sectional view of a fin field effect transistor (FinFET) in accordance with another embodiment. The FinFET 300 is of a bulk FinFET structure. The gate 306, the gate dielectric layer 308 and the active region 304 are similar to those shown in FIG. 2, and hence are not discussed in further detail herein. In accordance with an embodiment, the substrate 301 may be a crystalline structure. The substrate 301 may be formed of silicon, although it may also be formed of other group III, group IV, and/or group V elements, such as silicon, germanium, gallium, arsenic, and combinations thereof.

In accordance with an embodiment, the FinFET 300 may comprise an isolation region 302. As shown in FIG. 3, the bottom portion of the active region 304 is enclosed by the isolation region 302. The isolation region 302 may be implemented by an STI structure. The STI structure (e.g., isolation region 302) may be fabricated by using suitable techniques including photolithography and etching processes. In particular, the photolithography and etching processes may comprise depositing a commonly used mask material such as photoresist over the substrate 301, exposing the mask material to a pattern, etching the substrate 301 in accordance with the pattern. In this manner, a plurality of openings may be formed as a result. The openings are then filled with dielectric materials to form the STI structures (e.g., isolation regions 302). In accordance with an embodiment, the isolation regions may be filled with a dielectric material such as an oxide material, a high-density plasma (HDP) oxide or the like. A chemical mechanical polishing (CMP) process is then performed to remove excess portions of the dielectric materials, and the remaining portions are the isolation region 302.

As shown in FIG. 3, the isolation region 302 may be portions of a continuous region, which may form an isolation ring in accordance with an embodiment. Alternatively, the isolation region 302 may be two separate isolation regions having their sidewalls facing each other.

Figure 4:
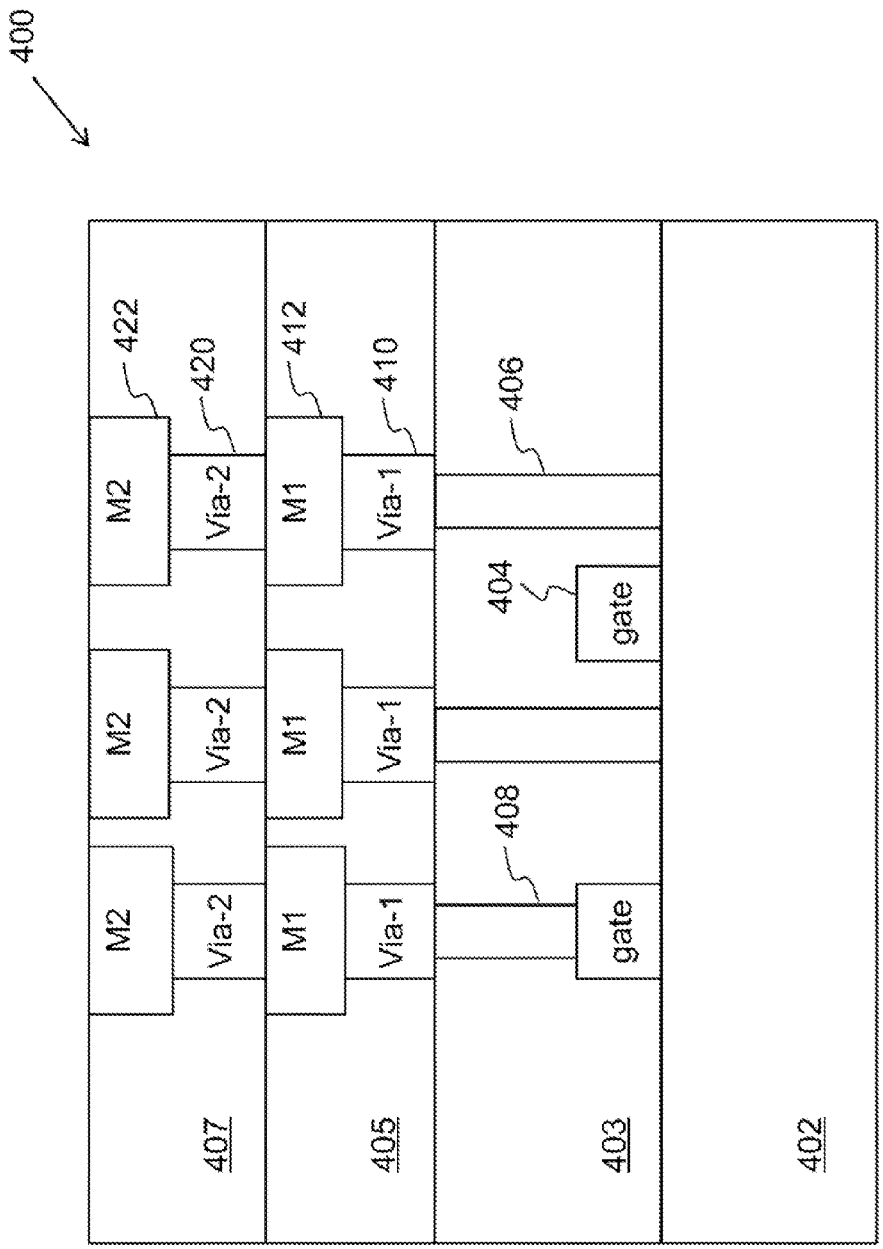
FIG. 4 illustrates a cross sectional view of a semiconductor device having a single contact structure in accordance with an embodiment.

FIG. 4 illustrates a cross sectional view of a semiconductor device having a single contact structure in accordance with an embodiment. The semiconductor device 400 includes a substrate 402 and a plurality of transistors (not shown) formed in the substrate. A gate 404 of a transistor is formed over the substrate 402. The gate 404 may comprise a gate electrode and a gate dielectric layer (not shown respectively).

As shown in FIG. 4, an inter-layer dielectric (ILD) layer 403 is formed over the substrate 402. The ILD layer 403 may comprise a material such as boron phosphorous silicate glass (BPSG), although any suitable dielectrics may be used for either layer. The ILD layer 403 may be formed using a process such as PECVD, although other processes, such as LPCVD, may alternatively be used.

There may be a plurality of contacts 406 and 408 coupled to the gate electrode 404 and other active regions such as a drain/source region (not shown). The contacts 406 and 408 may be formed through the ILD layer 403 with suitable photolithography and etching techniques. Generally, these photolithography techniques involve depositing a photoresist material, which is masked, exposed, and developed to expose portions of the ILD layer 403 that are to be removed. The remaining photoresist material protects the underlying material from subsequent processing steps, such as etching. The etching process may form trenches. The trenches may be filled with conductive materials to form contacts.

The contacts 406 and 408 may comprise a barrier/adhesion layer (not shown) to prevent diffusion and provide better adhesion for the contacts 406 and 408. In an embodiment, the barrier layer is formed of one or more layers of titanium, titanium nitride, tantalum, tantalum nitride, or the like. The barrier layer may be formed through chemical vapor deposition, although other techniques could alternatively be used.

The contacts 406 and 408 may be formed of any suitable conductive material, such as a highly-conductive, low-resistive metal, elemental metal, transition metal, or the like. In accordance with an embodiment, the contacts 406 and 408 are formed of tungsten, although other materials, such as Cu, Al, AlCu, TiN, TiW, Ti, TaN, Ta, Pt, or any combination thereof, could alternatively be utilized. In an embodiment in which the contacts 406 and 408 are formed of tungsten, the contacts 406 and 408 may be deposited by CVD techniques known in the art, although any method of formation could alternatively be used.

After the contacts 406 and 408 are formed, there may be a plurality of interconnect layers formed over the ILD layer 403. For simplicity, only two interconnect layers are illustrated to represent the inventive aspects of various embodiments. A first interconnect layer 405 is formed over the ILD layer 403. As shown in FIG. 4, the first interconnect layer 405 may comprise the first vias 410 and first metal lines 412. The first vias 410 and first metal lines 412 may be made through any suitable formation process (e.g., lithography with etching, damascene, dual damascene, or the like) and may be formed using suitable conductive materials such as copper, aluminum, aluminum alloys, copper alloys or the like.

A second interconnect layer 407 is formed over the first interconnect layer 405. The second interconnect layer 407 may include second vias 420 and second metal lines 422. In accordance with an embodiment, the second vias 420 and the second metal lines 422 are formed of conductive materials such as copper aluminum, aluminum alloys, copper alloys or the like. As shown in FIG. 4, the second metal lines 422 are electrically coupled to the first metal lines 412 through the second vias 420.

Figure 5:
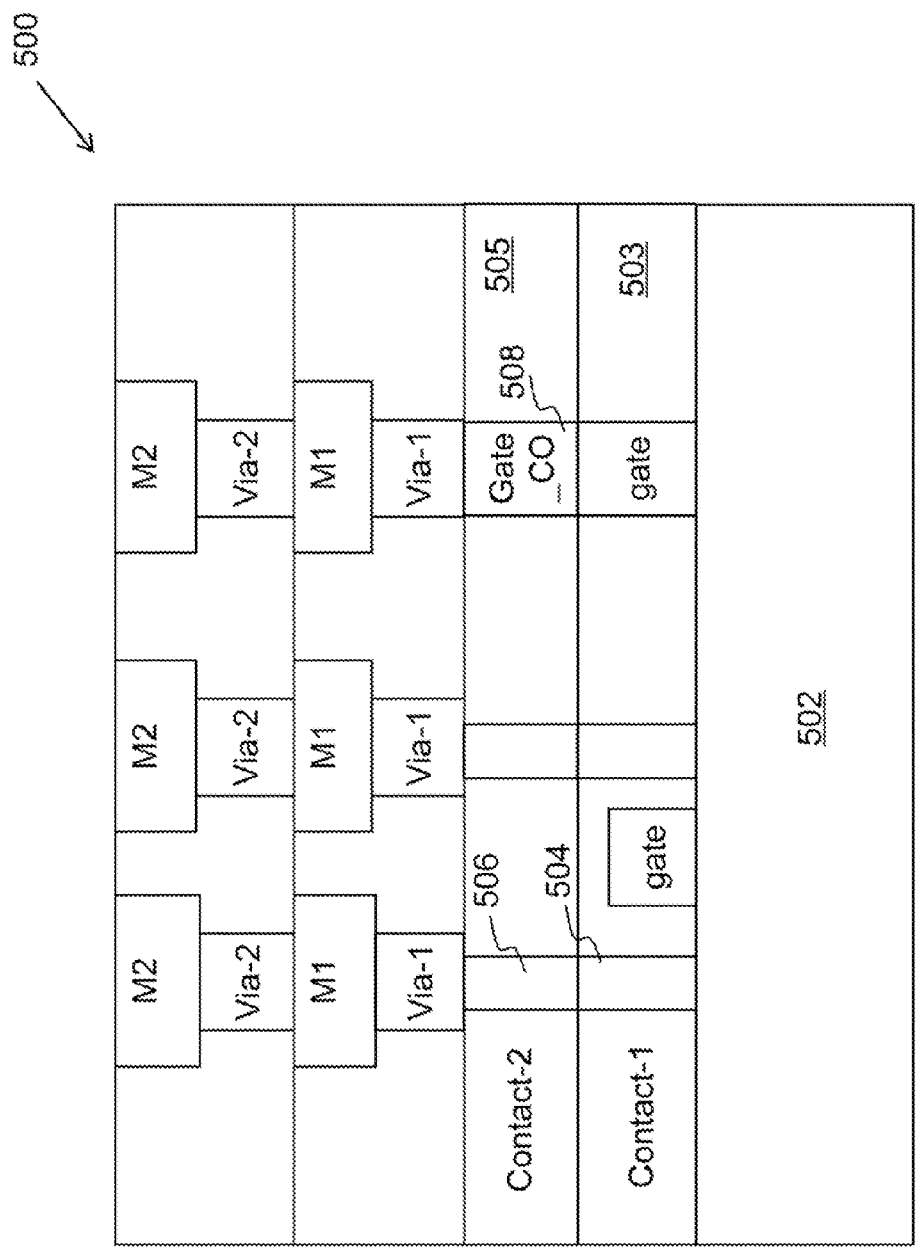
FIG. 5 illustrates a cross sectional view of a semiconductor device having a dual contact structure in accordance with an embodiment.

FIG. 5 illustrates a cross sectional view of a semiconductor device having a dual contact structure in accordance with an embodiment. The semiconductor device 500 are similar to the semiconductor device 400 expect that the semiconductor device 500 includes a dual contact structure. As shown in FIG. 5, there may be two contacts 504 and 506 electrically coupled to each other. In particular, the second-level contact 506 is formed over the first-level contact 504. Both the second-level contact 506 and the first-level contact 504 are formed in a first ILD layer 503. FIG. 5 also shows there may be a gate contact 508 formed between the gate and the first via.

As shown in FIG. 5, the first ILD layer 503 is deposited over the substrate 502. The first-level contact 504 may be formed through the first ILD layer 503 with suitable photolithography and etching techniques. Generally, these photolithography techniques involve depositing a photoresist material, which is masked, exposed, and developed to expose portions of the first ILD layer 503 that are to be removed. The remaining photoresist material protects the underlying material from subsequent processing steps, such as etching. The etching process may form trenches. The trenches may be filled with conductive materials to form the first-level contact 504.

After the first-level contact 504 has been formed, a second ILD layer 505 is deposited over the first ILD layer 503. The second-level contact 506 and the gate contact 508 may be formed through the second ILD layer 505 with suitable techniques similar to those employed in the formation of the first-level contact 504, and hence are not discussed in further detail to avoid unnecessary repetition.

Figure 6:
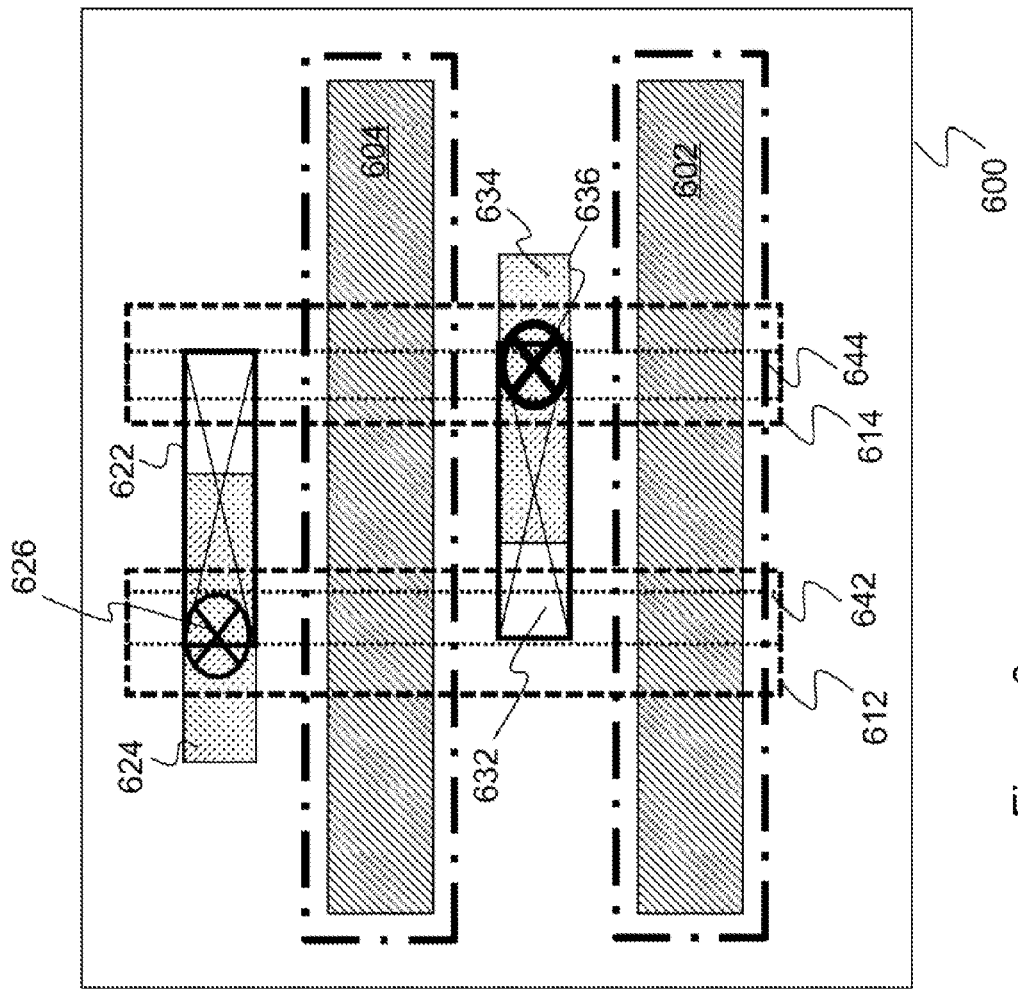
FIG. 6 illustrates a layout diagram of a ROM cell in accordance with an embodiment.
Figure 6:
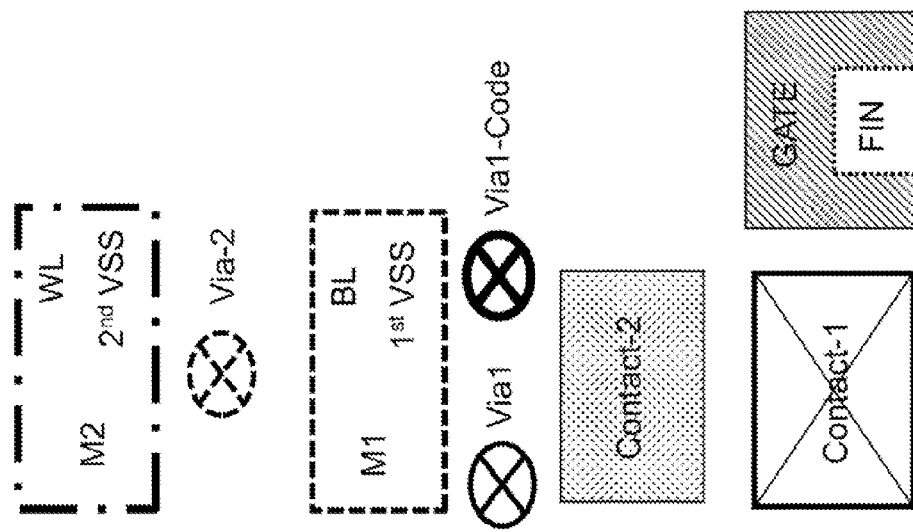

FIG. 6 illustrates a layout diagram of a ROM cell in accordance with an embodiment. The layout diagram includes a first active region 642 and a second active region 644. In accordance with an embodiment, the first active region 642 and the second active region 644 are a fin shaped structure protruding over the surface of the semiconductor substrate. As shown in FIG. 6, the first active region 642 and the second active region 644 are formed in parallel. A first gate region 602 and a second gate region 604 are formed in parallel. In addition, the gate regions such as gate region 604 and the active regions such as first active region 642 are orthogonal to each other. A transistor is formed at the cross point of a gate region (e.g., gate region 604) and an active region (e.g., active region 642).

In accordance with an embodiment, a first pass transistor of a ROM cell 600 is formed at the cross point of the second gate region 604 and the first active region 642. Likewise, a second pass transistor of the ROM cell 600 is formed at the cross point of the second gate region 604 and the second active region 644. The first pass transistor and the second pass transistor are connected in parallel so as to form a pass transistor of the ROM cell 600. In addition, a first isolation transistor is formed at the cross point of the first gate region 602 and the first active region 642. It should be noted that in accordance with an embodiment, the source of the first pass transistor is electrically coupled to the drain of the first isolation transistor. Likewise, a second isolation transistor is formed at the cross point of the first gate region 602 and the second active region 644. It should be noted that in accordance with an embodiment, the source of the second pass transistor is electrically coupled to the drain of the second isolation transistor.

The ROM cell 600 may include a plurality of pass transistors connected in parallel. In accordance with an embodiment, the pass element of the ROM cell 600 may include two pass transistors connected in parallel. As shown in FIG. 6, the first pass transistor is implemented by a first fin comprising a drain, a source and a channel region of the first pass transistor. Likewise, the second pass transistor is implemented by a second fin comprising a drain, a source and a channel region of the first pass transistor.

The ROM cell 600 is of a dual contact structure. There may be two interconnect layers M1 and M2 formed over the substrate of the ROM cell 600. As shown in FIG. 6, the first interconnect layer M1 is represented by a dashed rectangle. A bit line 612 and a first VSS line 614 of the ROM cell 600 are formed in the first interconnect layer M1. In comparison with traditional ROM cell fabrication techniques having a bit line formed in an upper interconnect layer such as a second interconnect layer M2, the structure shown in FIG. 6 can further reduce coupling capacitance by forming the bit line 612 in the first interconnect layer M1. One advantageous feature of having reduced coupling capacitance at the bit line is the sensing speed and function of the ROM cell 600 can be improved as a result.

The second interconnect layer M2 is represented by a dash-dotted rectangle. The word line and the second VSS line of this ROM cell 600 are formed in the second interconnect layer M2. The word line and the second VSS line are formed in parallel. In addition, the second VSS line is electrically coupled to the first VSS line. According to the schematic diagram shown in FIG. 1, there is a connection between the drain of the pass transistor and the bit line BL. In FIG. 6, such a connection is implemented by a first-level contact 622, a second-level contact 624 and a first via 626.

The first-level contact 622 is coupled to the drains of the two pass transistors. The first-level contact 632 is coupled to the sources of the two pass transistors. As shown in FIG. 6, despite that the second-level contact 624 is formed over the first-level contact 622, the second-level contact 624 is not aligned with the first level contact 622. Instead, there is a shift, also known as an offset, between the first level contact 622 and the second level contact 624. In particular, the second level contact 624 is shifted, i.e., is offset, to the left by a predetermined length. In accordance with an embodiment, the predetermined length is in a range from about one fourth of the length of the second level contact 624 to about one third of the length of the second level contact 624.

The sources of the first pass transistor and the second pass transistor are coupled to VSS through a coding configuration. In accordance with an embodiment, the VSS line is formed in the first interconnect layer M1. When the ROM cell 600 is predetermined to store an "off" state, a first via is not formed between the second-level contact and its corresponding VSS line formed in the first interconnect layer M1. In contrast, when the ROM cell 600 is predetermined to store an "on" state, a first via is formed between the second contact and its corresponding VSS line formed in the first interconnect layer M1.

In accordance with an embodiment, the ROM cell 600 of FIG. 6 is of an "on" state. In particular, there is a first via 636 formed between the second-level contact 634 and the first VSS line 614 formed in the first interconnect layer M1. As shown in FIG. 6, the second-level contact 634 is not aligned with the first level contact 632. Instead, there is a shift between the first-level contact 632 and the second-level contact 634. In particular, the second-level contact 634 is shifted to the right by a predetermined length. In accordance with an embodiment, the predetermined length is in a range from about one fourth of the length of the second-level contact 634 to about one third of the length of the second-level contact 634.

One advantageous feature of having a shift between the first-level contact (e.g., first-level contact 622) and its corresponding second level contact (e.g., second-level contact 624) is that the shift allows more layout margins for two adjacent second-level contacts (e.g., second-level contact 624 and second-level contact 634). In addition, the shift of the second-level contact 624 is in the opposite direction in comparison to the shift of the second-level contact 634. Such shifts in the opposite direction allow more layout margins for two adjacent second level contacts so that high density ROM integrated circuits may be obtained.

Figure 7:
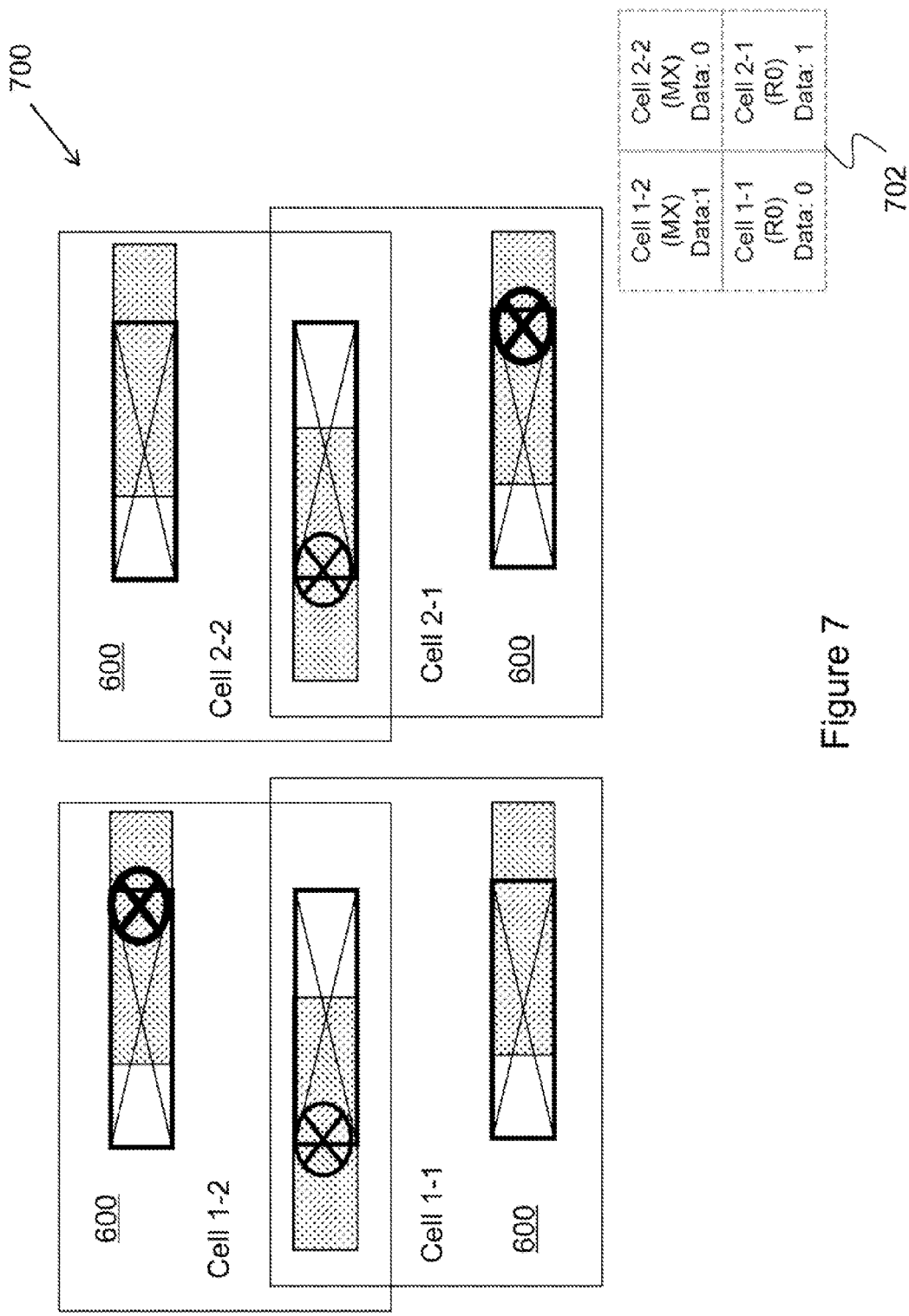
FIG. 7 illustrates a layout diagram of a ROM array in accordance with an embodiment.

FIG. 7 illustrates a layout diagram of a ROM array in accordance with an embodiment. The ROM array 700 has two columns and two rows. Each ROM cell of FIG. 7 is similar to the ROM cell 600 shown in FIG. 6 except that two adjacent pass transistors may share a common drain. For simplicity, FIG. 7 only illustrates the pass transistor of each ROM cell. As shown in FIG. 7, the pass transistor of Cell 1-2 and the pass transistor of Cell 1-1 share a common drain. Likewise, the pass transistor of Cell 2-2 and the pass transistor of Cell 2-1 share a common drain.

The ROM array 700 may comprise four ROM cells 600. The other elements of the ROM cell 600 has been described above with respect to FIG. 6, and hence is not discussed in further detail herein. In accordance with an embodiment, there is a coding via formed over the second-level contact at Cell 1-2. Therefore, a logic state of "1" is stored at Cell 1-2. Likewise, Cell 1-1 is of a logic state of "1" because there is a coding via formed over the second-level contact. In contrast, a coding via is not formed over the second-level contact of Cell 2-2 and Cell 1-1. Therefore, a logic state of "0" is stored at Cell 2-2 and Cell 1-1. A table 702 illustrates in detail the logic state of each ROM cell of the ROM array 700.

Figure 8:
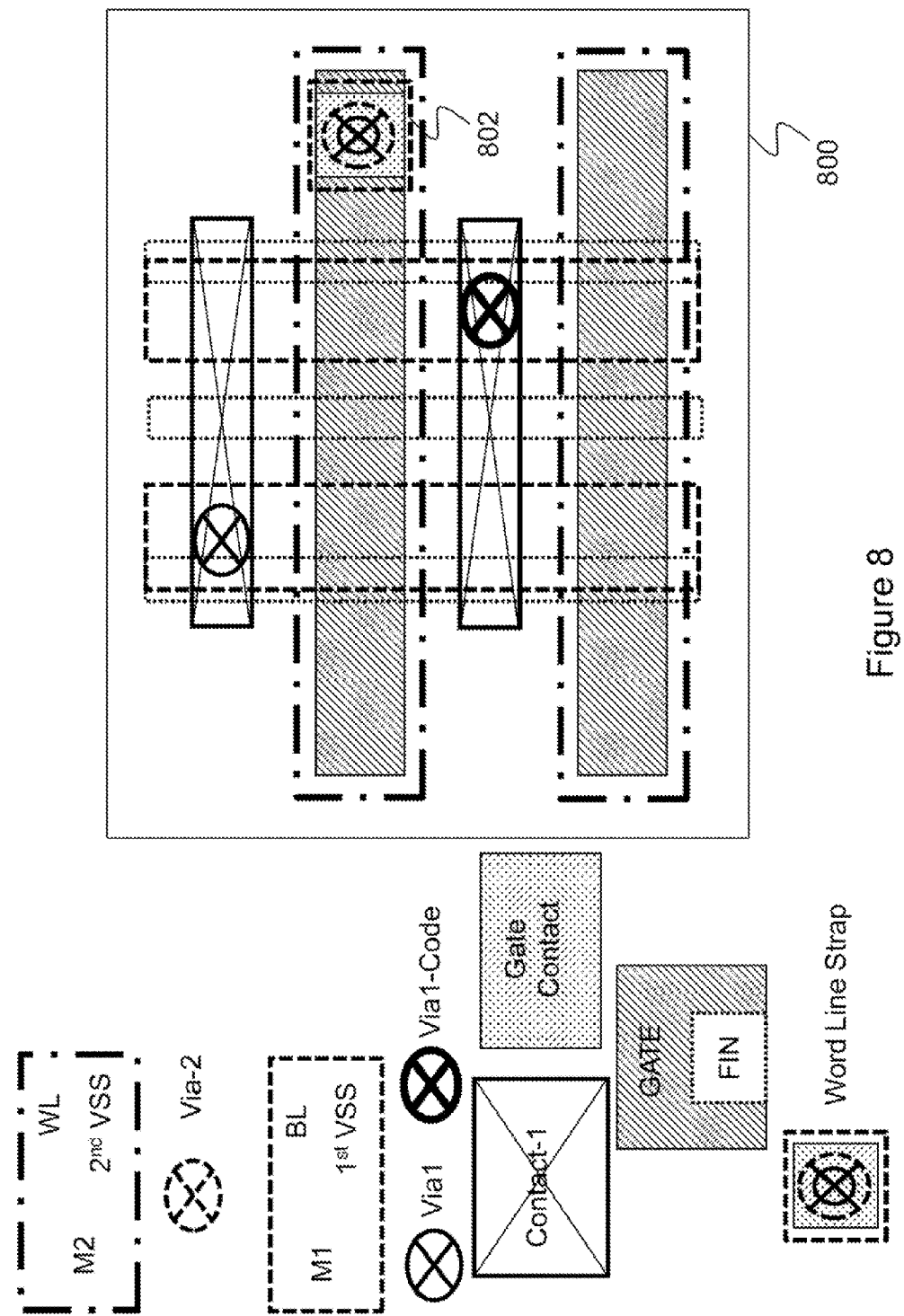
FIG. 8 illustrates a layout diagram of a ROM cell in accordance with another embodiment.

FIG. 8 illustrates a layout diagram of a ROM cell in accordance with another embodiment. The ROM cell 800 of FIG. 8 is similar to the ROM cell 600 shown in FIG. 6 except that there may be three pass transistors connected in parallel and a word line strap structure is employed to further improve the function and speed of a ROM cell. As shown in FIG. 8, there may be three fin structures protruding over the surface of the substrate. Three pass transistors are formed as a result. These three pass transistors may connect in parallel to form the pass transistor of the ROM cell 800.

The word line strap structure 802 comprises a gate contact, a first via, a first metal line and a second via (not shown respectively but illustrated in FIG. 5). The word line strap structure 802 provides a low voltage drop electrical connection from a word line formed in the second interconnect layer M2 and the gates of the pass transistors of the ROM cell 800. In addition, two horizontally adjacent pass transistors may share a single word line strap structure (not shown but illustrated in FIG. 9). It should be noted that the ROM cell 800 may be of a single contact structure shown in FIG. 4.

Figure 9:
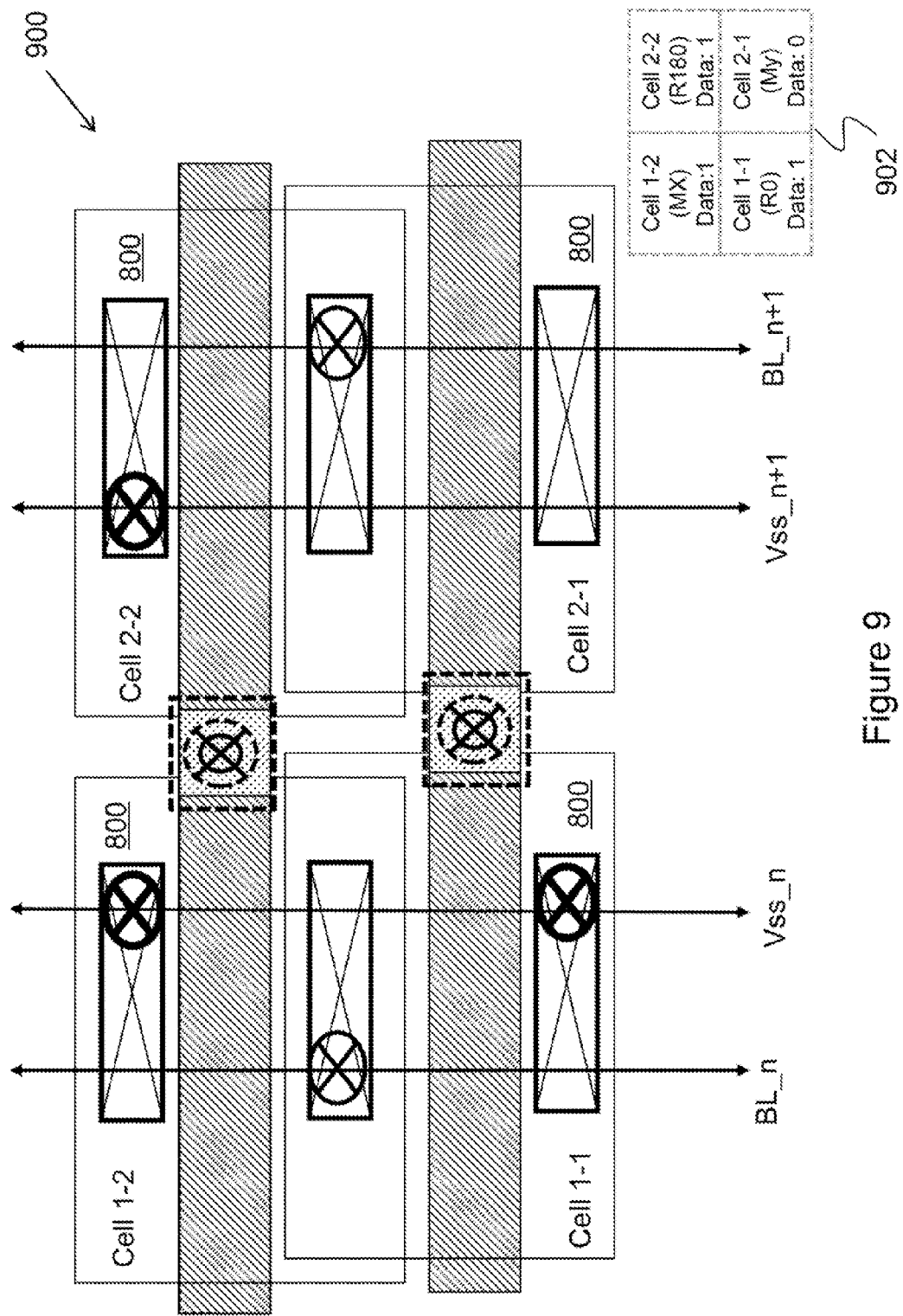
FIG. 9 illustrates a layout diagram of a ROM array in accordance with an embodiment.

FIG. 9 illustrates a layout diagram of a ROM array in accordance with an embodiment. Each ROM cell of FIG. 9 is similar to the ROM cell 800 shown in FIG. 8, and hence is not discussed in further detail herein. The ROM array 900 has two columns and two rows of ROM cells. In accordance with an embodiment, there is a coding via formed over the first-level contact at Cell 1-2. The coding via connects the source of the pass transistor with the VSS line VSS_n. Therefore, a logic state of "1" is stored at Cell 1-2. Likewise, Cell 2-2 and Cell 1-1 are of a logic state of "1" because two coding vias are applied to Cell 2-2 and Cell 1-1 respectively. In contrast, a coding via is not formed over the first-level contact of Cell 2-1. Therefore, a logic state of "0" is stored at Cell 2-1. A table 902 illustrates in detail the logic state of each ROM cell of the ROM array 900.

Figure 10:
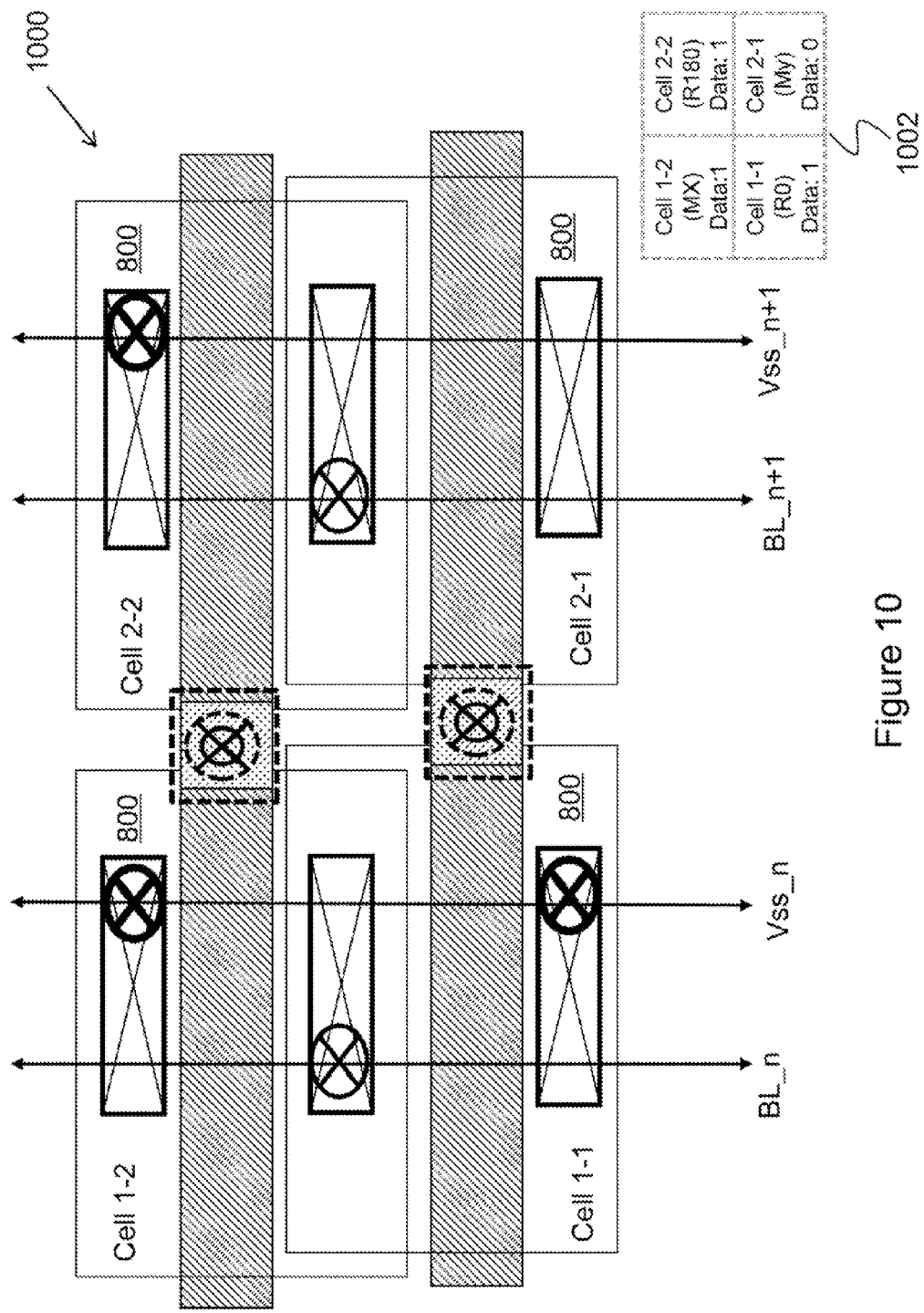
FIG. 10 illustrates a layout diagram of a ROM array in accordance with another embodiment.

FIG. 10 illustrates a layout diagram of a ROM array in accordance with another embodiment. The ROM array 1000 is similar to the ROM array 900 shown in FIG. 9 except that the VSS line Vss_n+1 and the bit line BL_n+1 swap their positions. The ROM array 1000 has two columns and two rows of ROM cells. A table 1002 illustrates in detail the logic state of each ROM cell of the ROM array 1000.

Figure 11:
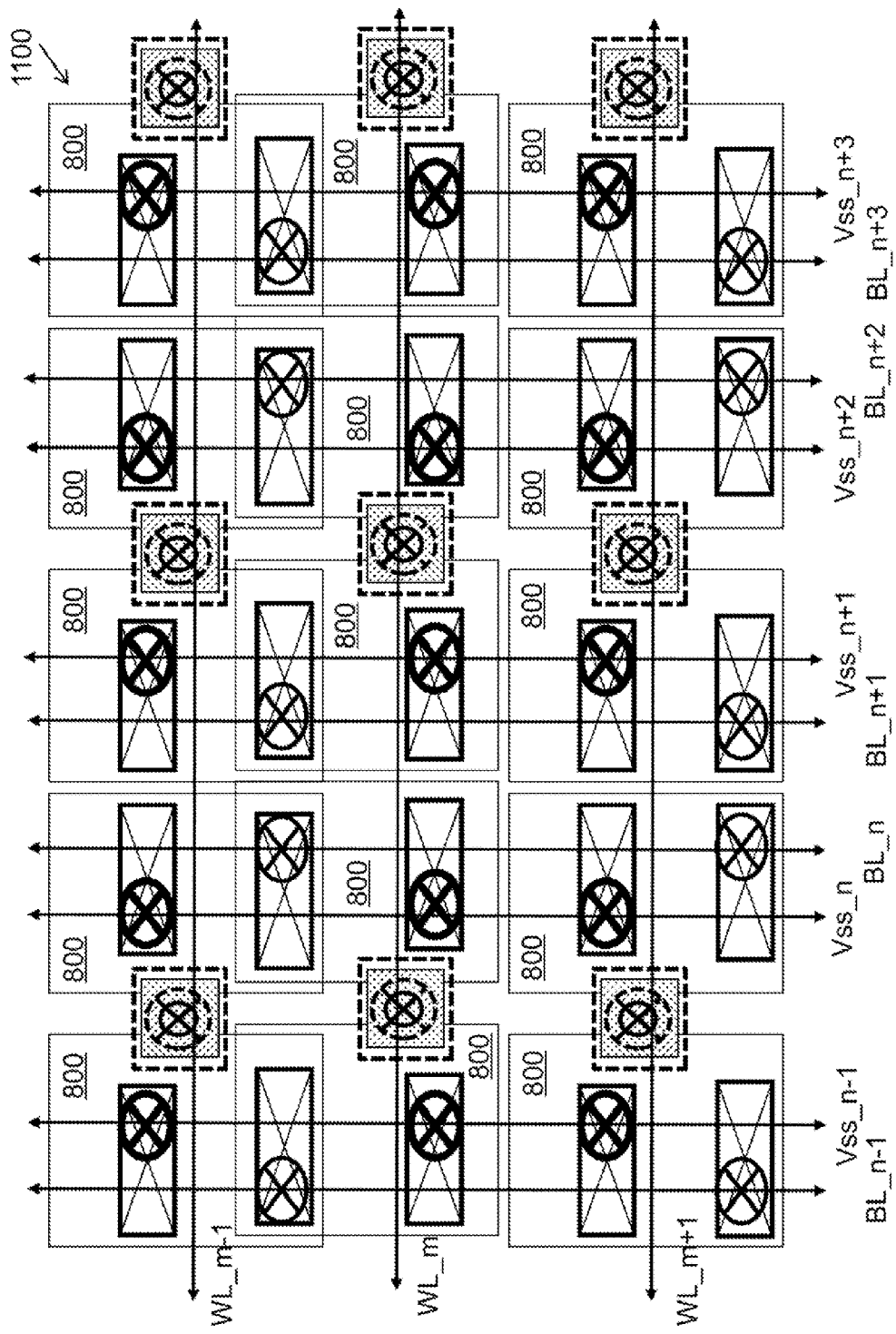
FIG. 11 illustrates a layout diagram of a ROM array of five columns and three rows in accordance with an embodiment.

FIG. 11 illustrates a layout diagram of a ROM array of five columns and three rows in accordance with an embodiment. Each ROM cell of FIG. 11 is similar to the ROM cell 800 shown in FIG. 8, and hence is not discussed in further detail herein. The ROM array 1100 has five columns and three rows of ROM cells. As shown in FIG. 11, two horizontally adjacent ROM cells share a word line strap structure.

Figure 12:
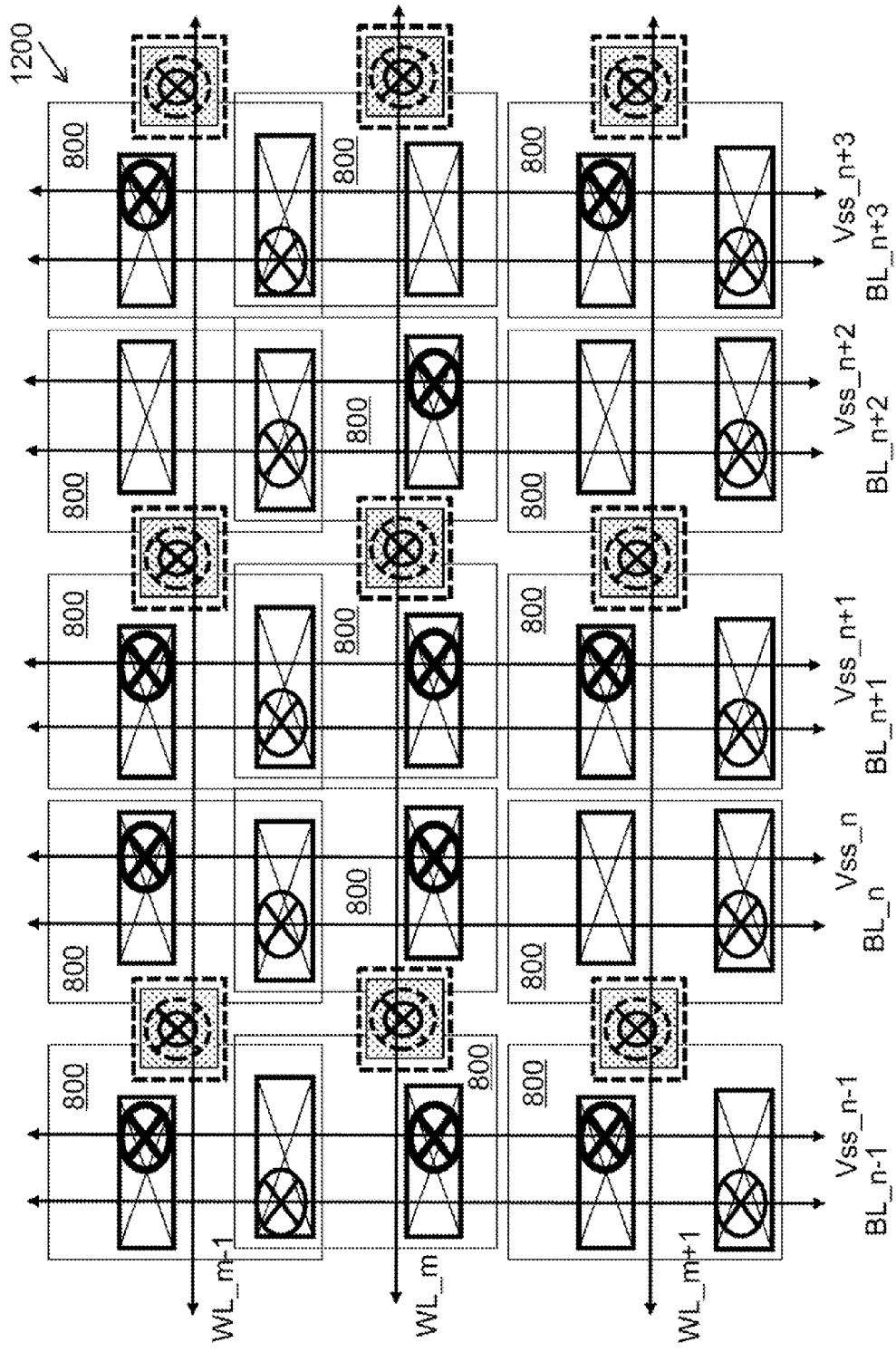
FIG. 12 illustrates a layout diagram of a ROM array of five columns and three rows in accordance with another embodiment.

FIG. 12 illustrates a layout diagram of a ROM array of five columns and three rows in accordance with another embodiment. The ROM array 1200 is similar to the ROM array 1100 shown in FIG. 11 except that in a pair of ROM cells sharing a word line strap structure, the VSS line and the bit line of the second ROM cell swap their positions in comparison with the ROM array 1000 shown in FIG. 11.

Figure 13:
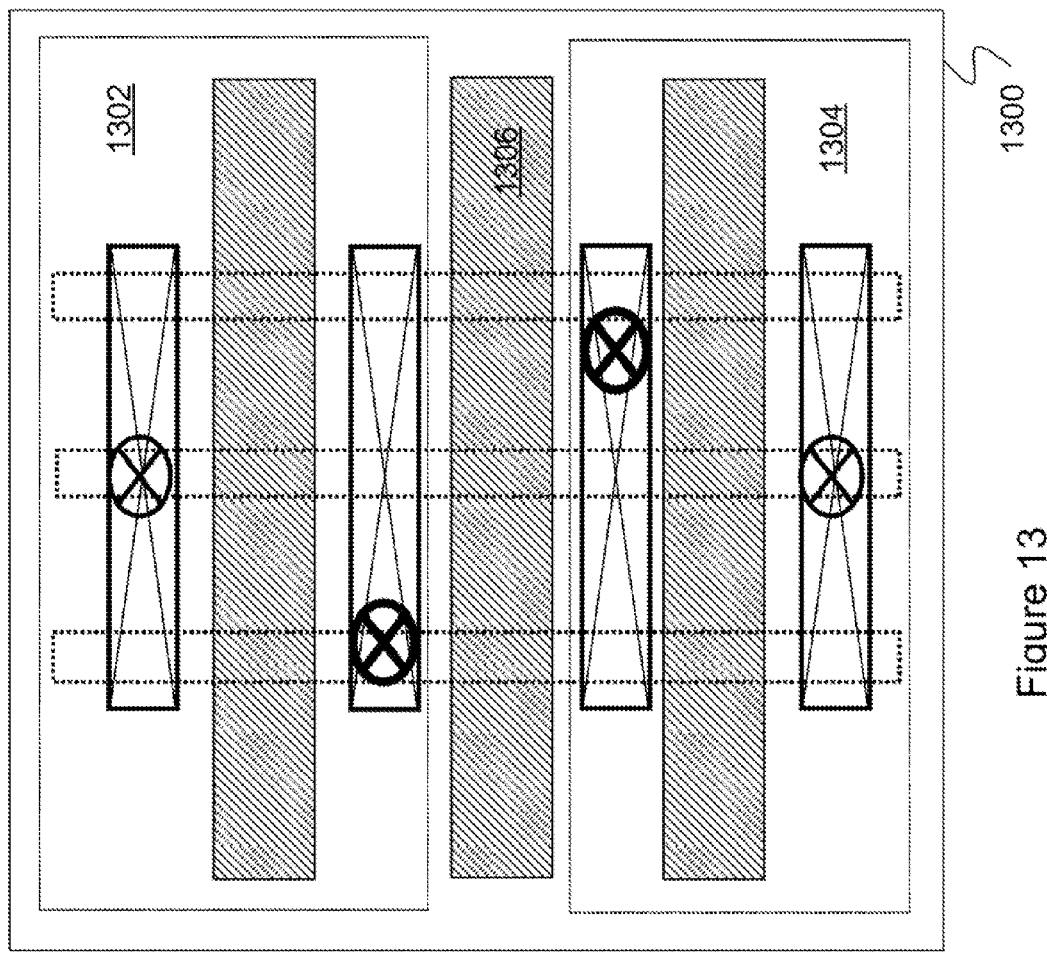
FIG. 13 illustrates a layout diagram of a ROM array in accordance with another embodiment.

FIG. 13 illustrates a layout diagram of a ROM array in accordance with another embodiment. The ROM array 1300 includes two ROM cells 1302 and 1304. The upper ROM cell 1302 and the bottom ROM cell 1304 are separated by an isolation transistor having a gate 1306. In accordance with an embodiment, the upper ROM cell 1302 and the bottom ROM cell 1304 have the same logic, namely a logic state of "1" stored in both ROM cells. As such, there are two coding vias formed in the upper ROM cell 1302 and the bottom ROM cell 1304 respectively.

As shown in FIG. 13, the first via coupled to the drain of the upper ROM cell 1302 is vertically aligned with the first via coupled to the drain of the bottom ROM cell 1304. The coding via coupled to the source of the upper ROM cell 1302 is not aligned with the coding via coupled to the source of the upper ROM cell 1304. More particularly, the coding via of the upper ROM cell 1302 shifts to the left and the coding via of the bottom ROM cell 1304 shifts to the right. The separation between the upper coding via and the bottom coding via helps to create more layout margins. As a result, both upper coding via and the bottom coding via can be formed from a single lithography patterning step such as a first lithography patterning step of a multiple lithography steps. It should be noted that the first-level vias may be formed by a plurality of lithography patterning steps.

Figure 14:
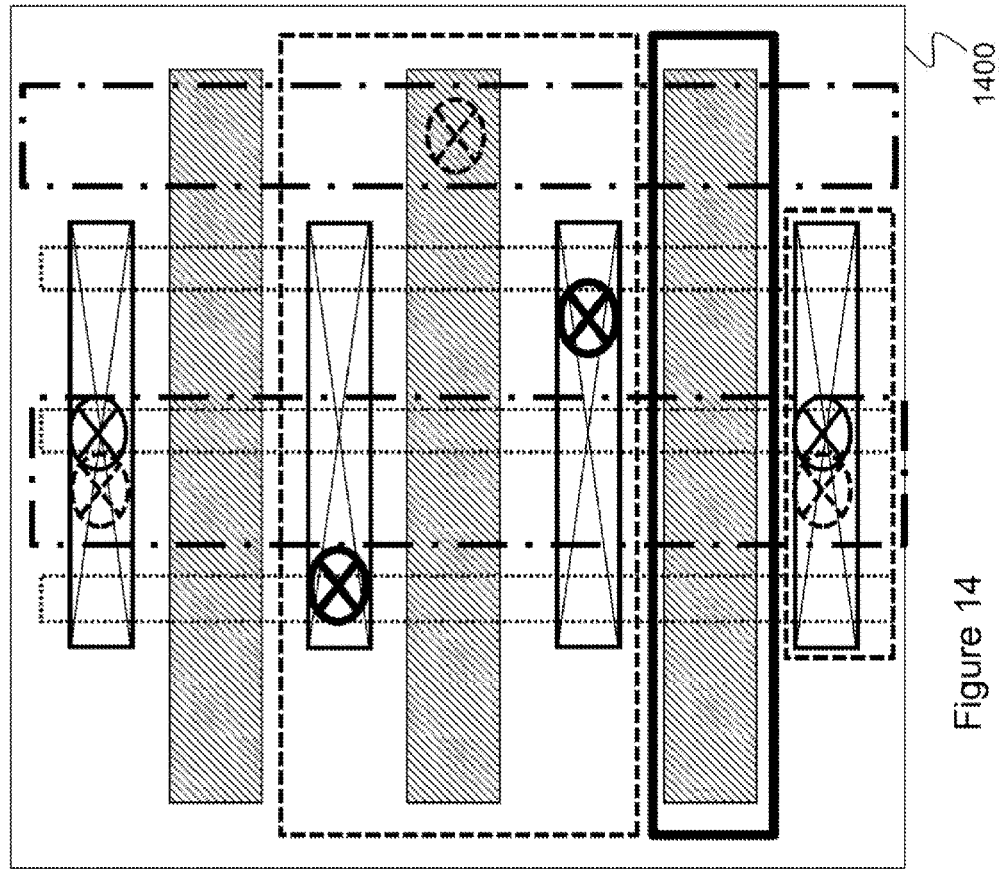
FIG. 14 illustrates in detail a layout diagram of the ROM array shown in FIG. 13 in accordance with an embodiment.
Figure 14:
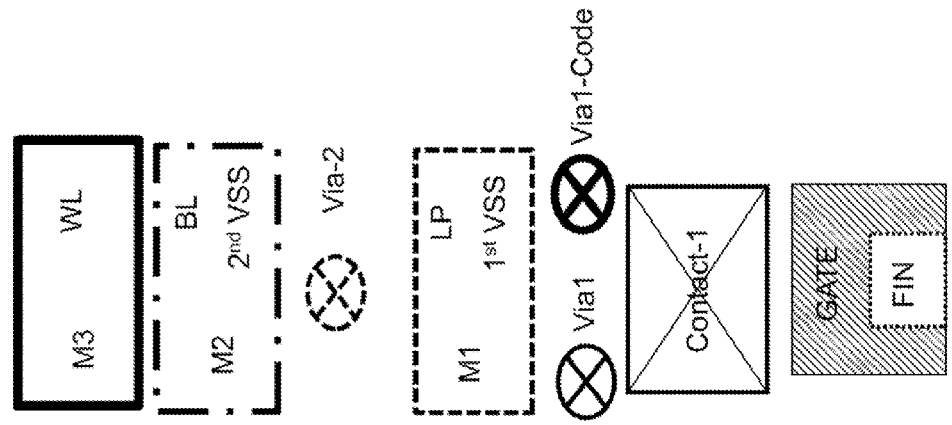

FIG. 14 illustrates in detail a layout diagram of the ROM array shown in FIG. 13 in accordance with an embodiment. The ROM array 1400 has one column and two rows. The coding via of the ROM cell in the first row is not aligned with the coding via of the ROM cell in the second row. Instead, the coding via of the ROM cell in the first row shifts to the left and the coding via of the ROM cell in the second row shifts to the right. FIG. 14 further illustrates the land pad of the bit line and a first VSS line may be formed in the first interconnect layer M1. The bit line and the second the word line is formed in the second interconnect layer M2. It should be noted that the first VSS line and the second VSS line are electrically coupled to each other through a second via. The word line is formed in the third interconnect layer M3. The drain of each pass transistor is coupled to the bit line through a conductive path formed by a first-level contact, a first via and a second via.

Figure 15:
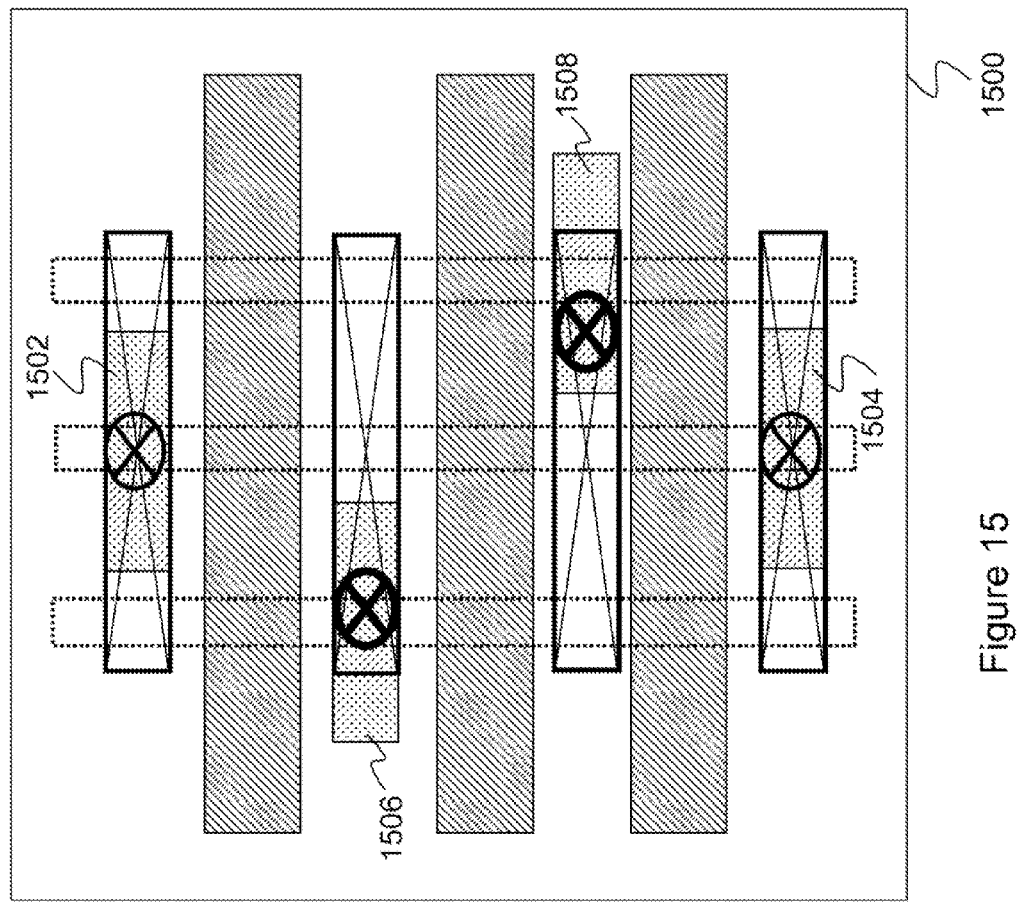
FIG. 15 illustrates a layout diagram of a ROM array in accordance with another embodiment.
Figure 15:
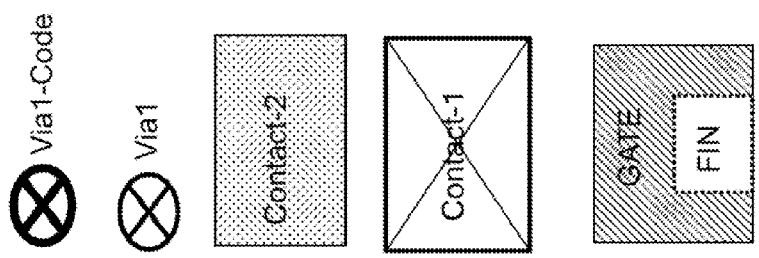

FIG. 15 illustrates a layout diagram of a ROM array in accordance with another embodiment. The ROM array 1500 is similar to the ROM array 1300 shown in FIG. 13 except that the ROM array 1500 includes a second-level contact and there is a shift of the second-level contact. In particular, the second-level contact 1502 formed over the drain of the first pass transistor and the second-level contact 15004 formed over the drain of the second pass transistor are aligned to each other. However, as shown in FIG. 15, the second-level contact 1506 formed over the source of the first pass transistor and the second-level contact 1508 formed over the source of the second pass transistor are not aligned to each other. The second-level contact 1506 formed over the source of the ROM cell in the first row shifts to the left. The second-level contact 1508 formed over the source of the ROM cell in the second row shifts to the right. As such, there is more layout space between two second level contacts adjacent to each other. As a result, the density of a ROM integrated circuit can be further improved.

Figure 16:
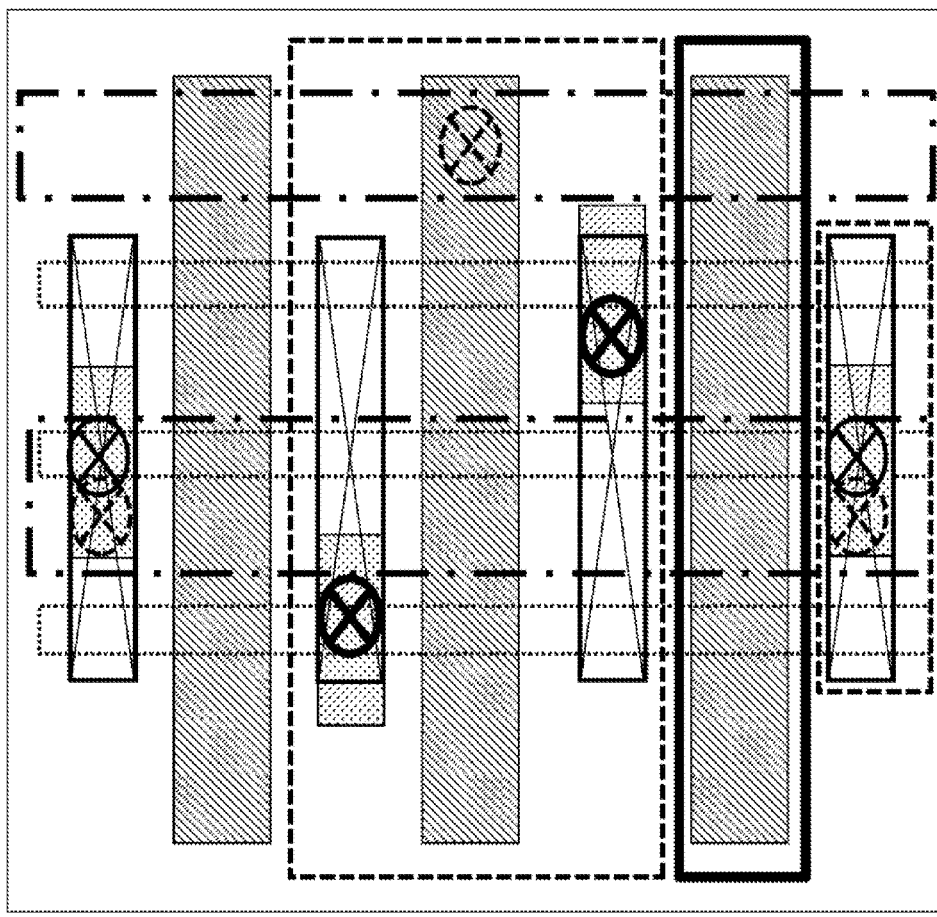
FIG. 16 in detail a layout diagram of the ROM array shown in FIG. 15 in accordance with an embodiment.
Figure 16:
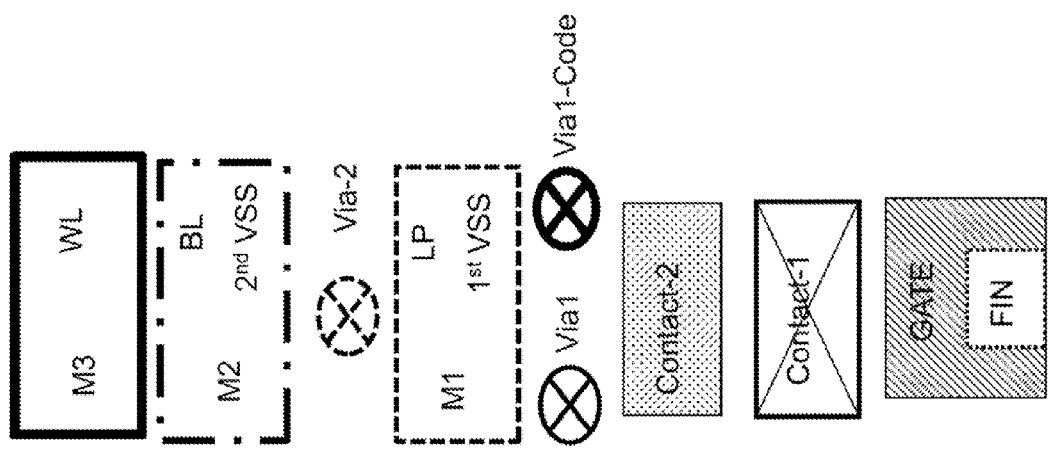

FIG. 16 illustrates in detail a layout diagram of the ROM array shown in FIG. 15 in accordance with an embodiment. The ROM array 1600 has one column and two rows. The system configuration of ROM array 1600 is similar to the ROM array 1400, and hence is discussed herein. The coding via of the ROM cell in the first row is not aligned with the coding via of the ROM cell in the second row. Instead, the coding via of the ROM cell in the first row shifts to the left and the coding via of the ROM cell in the second row shifts to the right. In addition, the second-level contact formed over the source of the ROM cell in the first row shifts to the left. The second-level contact formed over the source of the ROM cell in the second row shifts to the right. As such, there is more layout space between two second level contacts adjacent to each other.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:
1. An apparatus comprising:
a first first-level contact formed on a first active region of a transistor of a memory cell;
a first second-level contact formed on the first first-level contact, wherein the first second-level contact is offset in a first direction with reference to the first first-level contact;

a second first-level contact formed on a second active region of the transistor of the memory cell, wherein the second first-level contact is aligned with the first first-level contact; and a second second-level formed on the second first-level contact, wherein the second second-level contact is offset in a second direction with reference to the second first-level contact, and wherein the first direction is opposite to the second direction.

2. The apparatus of claim 1, wherein the transistor is a pass transistor of a read only memory (ROM) cell.

3. The apparatus of claim 1, wherein the first active region, the second active region and a channel between the first active region and the second active region form a fin structure protruding over a surface of a substrate.

4. The apparatus of claim 1, wherein:
the first active region is a drain of the transistor; and
the second active region is a source of the transistor.

5. The apparatus of claim 1, further comprising:
a first first-level via formed on the first second-level contact;
a second first-level via formed on the second second-level contact, wherein the second first-level via functions as a coding layer of a ROM cell;
a first interconnect layer formed over the first first-level via and the second first-level via;
a bit line formed in the first interconnect layer; and
a VSS line formed in the first interconnect layer, wherein the VSS line and the bit line are routed in parallel.

6. The apparatus of claim 5, further comprising:
a second-level via formed over the first interconnect layer;
a second interconnect layer formed over the second-level via; and
a word line formed in the second interconnect layer, wherein the word line is coupled to a gate of the transistor through the second-level via.

7. The apparatus of claim 6, wherein:
the first active region is electrically coupled to the bit line through a first conductive channel formed by the first first-level contact, the first second-level contact and a first first-level via.

8. A system comprising:
a first memory cell comprising:
a first pass transistor comprising:
a first drain coupled to a first bit line through a first conductive path formed by a first first-level contact and a first first-level via, wherein the first bit line is formed in a first interconnect layer;
a first gate coupled to a first word line through a word line strap structure, wherein the first word line is in a second interconnect layer formed over the first interconnect layer; and
a first source coupled to a first VSS line through a first coding layer; and
a second memory cell horizontally adjacent to the first memory cell, wherein the second memory cell comprises a second pass transistor having a second gate coupled to the first word line through the word line strap structure.

9. The system of claim 8, wherein:
the first bit line and the first VSS line are formed in a first interconnect layer; and
the first bit line and the first VSS line are routed in parallel.

10. The system of claim 9, further comprising:
a second interconnect layer formed over the first interconnect layer, wherein the first word line is formed in the second interconnect layer.

11. The system of claim 8, wherein the word line strap structure comprises:
a first gate contact electrically coupled to the first gate and a second gate of a second pass transistor of the second memory cell;
a second first-level via electrically coupled to the first gate contact;
a first metal line formed in the first interconnect layer and electrically coupled to the second first-level via; and
a first second-level via electrically coupled to the first metal line.

12. The system of claim 8, further comprising:
a first second-level contact formed over the first first-level contact;
a second first-level contact formed over the first source; and
a second second-level contact formed over the second first-level contact.

13. The system of claim 12, wherein:
the first second-level contact is offset in a first direction with reference to the first-level contact;
the second first-level contact is aligned with the first first-level contact; and
the second second-level contact is offset in a second direction with reference to the second first-level contact.

14. The system of claim 13, wherein the first direction is opposite to the second direction.

15. A memory array comprising:
a first memory cell comprising a first pass transistor, wherein the first pass transistor comprises:
a first drain coupled to a first bit line through a first first-level contact, a first second-level contact and a first first-level via; and
a first source coupled to a first VSS line through a second first-level contact, a second second-level contact and a first coding via; and
a second memory cell comprising a second pass transistor, wherein the second pass transistor comprises:
a second drain coupled to a second bit line through a third first-level contact, a third second-level contact and a second first-level via; and
a second source coupled to a second VSS line through a fourth first-level contact, a fourth second-level contact and a second coding via, wherein the first first-level via is vertically aligned with the second first-level via, and wherein the first coding via is offset horizontally in a first direction with reference to the first first-level via and the second coding via is offset horizontally in a second direction with reference to the second first-level via.

16. The memory array of claim 15, wherein:
the second memory cell is formed adjacent to the first memory cell; and
the second memory cell and the first memory cell are separated by an isolation transistor.

17. The memory array of claim 15, wherein:
the first direction is opposite to the second direction.

18. The memory array of claim 15, wherein the first source is formed adjacent to the second source, and wherein the first source and the second source are separated by an isolation transistor.

19. The memory array of claim 18, wherein:
the second second-level contact is offset in a third direction with reference to the second first-level contact; and
the third second-level contact is offset in a fourth direction with reference to the third first-level contact.

20. The memory array of claim 19, wherein:
the third direction is opposite to the fourth direction.

* * * * *

UNITED STATES PATENT AND TRADEMARK OFFICE
CERTIFICATE OF CORRECTION

PATENT NO. : 8,750,011 B2  
APPLICATION NO. : 13/423968  
DATED : June 10, 2014  
INVENTOR(S) : Jhon-Jhy Liaw Page 1 of 1

It is certified that error appears in the above-identified patent and that said Letters Patent is hereby corrected as shown below:

In the Claims:

In Col. 12, line 20, claim 13, immediately after "with reference to the" insert --first--.

Signed and Sealed this  
Second Day of September, 2014

Michelle K. Lee  
*Deputy Director of the United States Patent and Trademark Office*